June 5, 1962 R. L. MAY ET AL 3,037,390

SINGLE SOLENOID SIGNAL TUNED RECEIVER

Filed Sept. 30, 1959 4 Sheets-Sheet 1

INVENTORS
Richard L. May &
BY Frank H. Ingwersen
Robert E. Fowler
ATTORNEY

SINGLE SOLENOID SIGNAL TUNED RECEIVER

Filed Sept. 30, 1959 4 Sheets-Sheet 2

INVENTORS
Richard L. May &
BY Frank H. Ingwersen
Robert E. Fowler
ATTORNEY

June 5, 1962 R. L. MAY ETAL 3,037,390

SINGLE SOLENOID SIGNAL TUNED RECEIVER

Filed Sept. 30, 1959 4 Sheets-Sheet 3

INVENTORS
Richard L. May &
BY Frank H. Ingwersen
Robert E. Fowler
ATTORNEY

INVENTORS
Richard L. May &
BY Frank H. Ingwersen
Robert E. Fowler
ATTORNEY 3,037,390
Patented June 5, 1962

3,037,390

SINGLE SOLENOID SIGNAL TUNED RECEIVER

Richard L. May and Frank H. Ingwersen, Kokomo, Ind., assignors to General Motors Corporation, Detroit, Mich., a corporation of Delaware Filed Sept. 30, 1959, Ser. No. 843,554
3 Claims. (Cl. 74—10.27)

This invention relates to means for tuning radio equipment and more particularly for means providing a plurality of different types of tuning means for radio broadcast receivers. In order to tune radio broadcast receivers, current mechanisms now on the market provide a combination of conventional manual tuning, preset mechanical push button tuning, and automatic signal seeking tuning. As an example of a tuner of this type reference is made to Patent No. 2,852,944, filed March 9, 1956 entitled Combined Signal Seeking, Push Button and Manual Tuner issued to George M. Gaskill on September 23, 1958. In this type of combination tuning equipment the tuning means itself has to be capable of being moved over its complete mechanical path by any one of the three different types of drive means independently and also for the signal seeking portion of operation, power means capable of independent motion aside from that while moving the tuning means is necessary.

In one form of combination tuners power loaded spring means are provided to drive the tuning means over the frequency band for which the receiver is designed and when the power loaded spring means reaches a particular discharged condition additional means must be provided for charging it in order that it may continue driving the tuner. In addition, since the tuner and power driving means may be moved at different times during operation and become dephased, separate means has been provided for moving the tuner means between its limits whether or not the spring driving means has to be re-loaded. In prior commercial designs two separate solenoid means have been provided for this purpose as shown in the above identified Patent No. 2,852,944 to Gaskill. In that construction, when the treadle bar which moves the tuning means approaches the high frequency end of its travel, a limit switch is closed energizing one of the solenoids and its energization quickly moves the tuning means to the low frequency end again for a continuation of tuning movement up frequency. On the other hand if the power driving spring becomes discharged even though the tuner may be at any mid-range position, the driving spring mechanism independently closes a limit switch to energize the alternate solenoid and its energization quickly re-charges the spring so that automatic tuning may resume.

The reason that these two portions become dis-synchronized is that the mechanical push button tuning section is capable of moving the tuning means independently of the driving spring to any location within the range. Thus, assuming that a tuner is positioned at the low frequency end of the band to scan up frequency and that the power driving spring is at the same time fully charged, during automatic tuning the two would proceed normally, the tuner moving up frequency to any part of the band and the spring slowly discharging without either of the solenoids being energized throughout a full scanning cycle. Assuming that a station was tuned in at approximate mid-range and that the operator listened to that station for a while and then instead of pressing the signal seeking switch again to signal tune, instead actuated one of the mechanical push button sections, which would bring the tuner almost to the top of the frequency band, to a position where it should be returned to the opposite end of the band but the power driving mechanism would only be half discharged. This is due to the de-clutching arrangement between the treadle bar tuner and the power driving means actuated when any of the mechanical push buttons are depressed. Any other de-phasing may, of course, occur, the above being merely an example. Solenoids for accomplishing mechanical movements of the tuner or loading the driving spring of the above mentioned type, are expensive, and in order to reduce the price of combination tuners it is desired to eliminate one of the actuating solenoids and have a single solenoid both load the spring and move the tuner.

It is, therefore, the object of the present invention to provide means for tuning radio receiving means by either manual, mechanical preset push button or signal seeking tuned means utilizing therein only a single solenoid for either moving the tuning means back to one limit position and/or re-load the power driving means.

With these and other objects in view which will become apparent as the specification proceeds, our invention will be best understood by reference to the following specification and claims and the illustrations in the accompanying drawings, in which:

Figure 1:
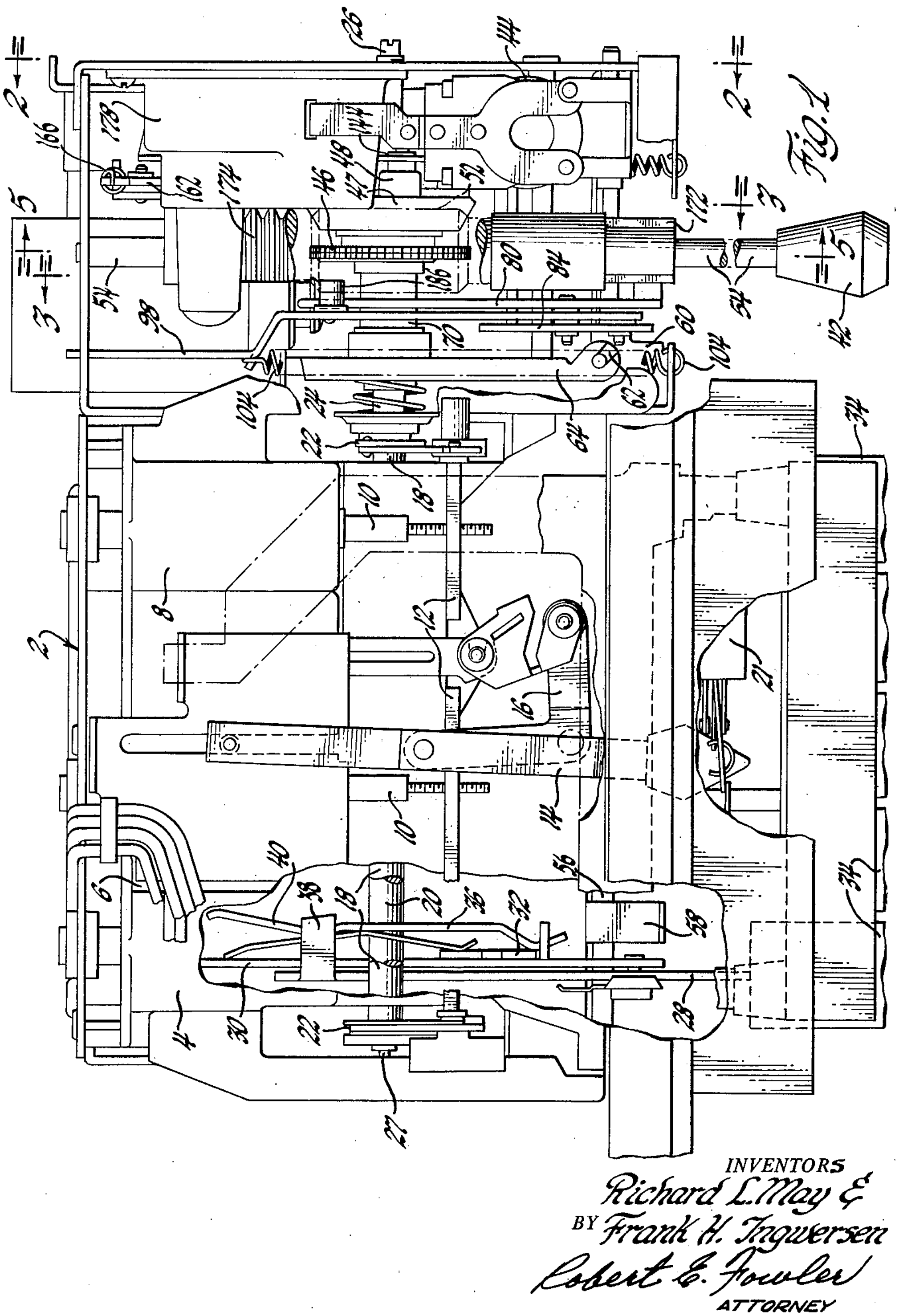
FIGURE 1 is a top plan view of a combination tuner incorporating our invention.
Figure 2:
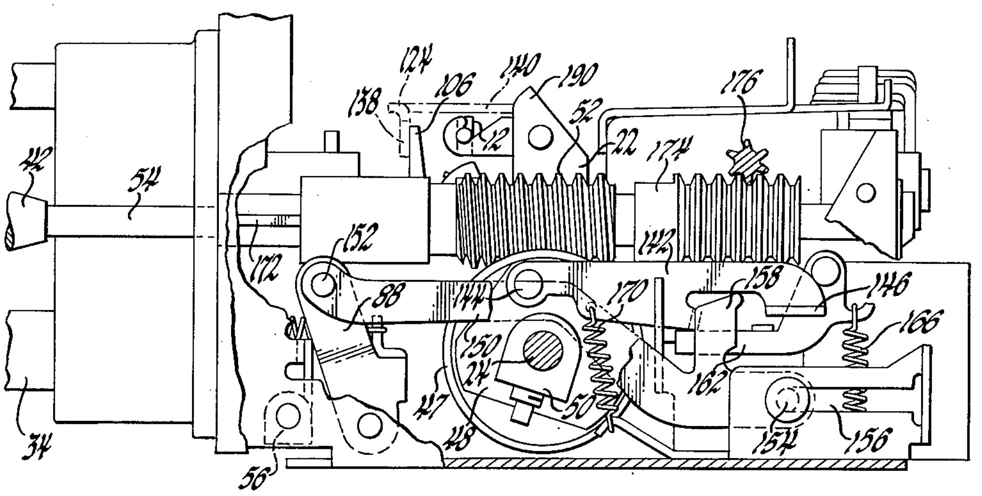
FIG. 2 is a sectional view taken on line 2—2 of FIG 1.
Figure 3:
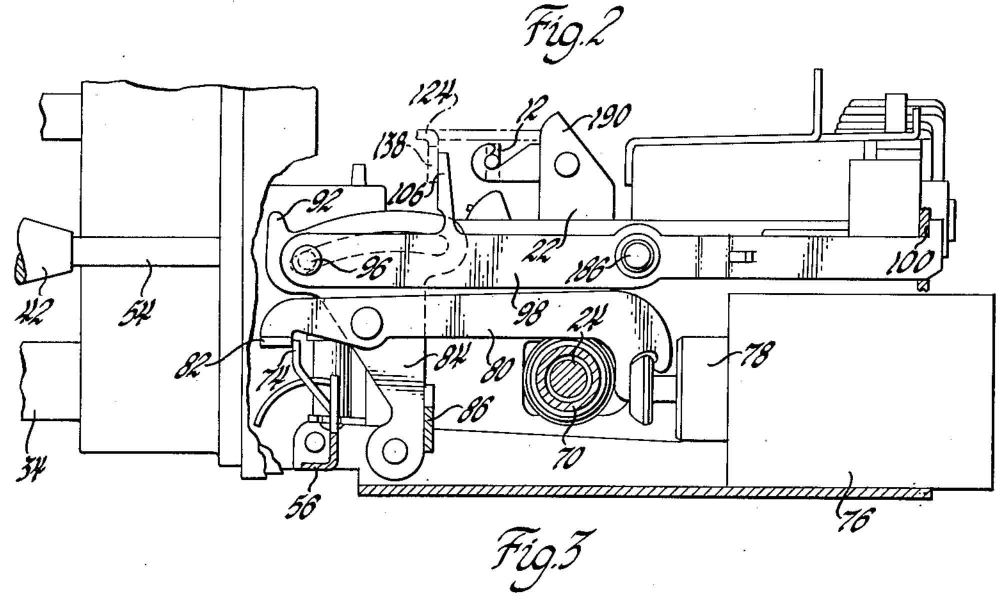
FIG. 3 is a sectional view taken on line 3—3 of FIG. 1.

Referring now more particularly to FIG. 1 there is shown therein a complete combination tuner providing the three types of tuning. In that tuner there is shown a supporting frame 2 upon which are mounted a plurality of tuning coils 4, 6 and 8 for a conventional radio receiving circuit, the three tuning coils being tuned by the insertion and withdrawal of associated comminuted iron cores 10 which are adjustably mounted on a reciprocating cross-frame member 12. The position of the cross-frame member and thus the frequency to which the tuner is adjusted is indicated by an indicating arm 14 connected through a linkage 16 to the tuning carriage or cross-member 12. The reciprocating cross-member 12 has its opposite ends secured to a treadle bar mechanism formed of two transverse rods 18 and 20 which terminate in centrally pivoted side members 22 on both ends, the right-hand pivoted side member 22 of FIG. 1 is directly connected to a shaft 24 rotatably mounted in the frame and having one end supported by an adjustable screw 26 in the righthand side frame member. The lefthand side member 22 is pivotally supported in the opposite side of the frame on a stub shaft 27. Thus, as the treadle bar assembly rotates about the axes of shafts 24 and 27 the cores 10 move in and out with respect to the tuning coils 4, 6 and 8 to tune the receiver and the position of the tuning mechanism is indicated by the pointer 14.

The treadle bar mechanism is adapted to be moved directly by a series of reciprocating push button assemblies which are adapted to bring the treadle bar and its associated tuning mechanism to certain predetermined mechanical positions for receiving desired stations. As illustrative only the tuning mechanism is shown with five push button assemblies although the particular number is not important. Each of these assemblies is formed of a plurality of slides 28 and 30 which ordinarily are locked together to move as a unit and which carry a pivotally adjustable indexing cam 32 thereon. On the outer end of one slide 28 there is mounted a push button 34 for manual engagement. The slide assembly is so mounted that it passes through between the two treadle bar rods 18 and 20. As the operator presses on the push button 34 the whole slide assembly which is trunnioned in slots in the frame moves in and the cam 32 engages rods 18 and 20 to cause the treadle bar assembly to rotate to a certain predetermined angular position where both sides of the cam will engage the rods. This will tune in a particular station. To release the cam for setting to a different angular position the slide 28 can be pulled outwardly with respect to slide 30 which releases the side spring pressure of lever 36 on the face of cam 32. As shown in the broken away section of FIG. 1 the cam is unlocked for resetting and slide 28 pulled forwardly. When slide 28 is forced to the rear, saddle 38 slides up on cam surface 40 to pull the lever 36 inwardly and pinch the cam 32 to lock the same in position. After this action the slides then move as a unit for positioning the treadle bar. Thus depression of any one of the push buttons 34 will turn the treadle bar assembly 18, 20 to different preset mechanical positions and tune in desired stations.

The tuning means may also be moved by rotation of the manual knob 42 or through operation of signal seeking tuning through closure of a signal seeking tuner initiating switch 21 which controls the energization of control relay 44. Energization of this relay removes the detent from the governor train and permits the power driving spring to drive the tuning means from the low frequency towards the high frequency end. Both the manual and the signal seeking drive are accomplished through a disconnect clutch to the treadle bar and tuner which clutch includes a worm wheel 46 mounted on a sleeve 70 free to rotate on shaft 24, said wheel 46 having one clutch face 47 and a second clutch member 48 engaging the same, the latter being firmly secured to shaft 24 through a collar and set screw connection 50. With the clutch parts 47—48 in engagement rotation of the manual knob 42 will drive worm 52 mounted on shaft 54 upon the outer end of which knob 42 is mounted and rotation of the worm 52 will drive the worm wheel 46 to drive shaft 24 and the tuner.

When any one of the push buttons 34 is depressed, initial movement of the reciprocating assembly causes the clutch actuating bar 56 to be rotated about its longitudinal axis to actuate the clutch, de-clutching the manual and automatic drive from the treadle bar assembly. The clutch actuating bar 56 is pivoted for rotation about its longitudinal axis and extends substantially across the front of the complete tuner. It is provided with a series of curved forwardly projecting ears 58 adapted to lie behind each of the push buttons 34 so that as one of the buttons is forced inwardly the inner surface of the button engages its corresponding curved projecting ear 58 and cause rotation of the clutch actuating bar 56. This rotation in turn brings one side of the offset angled actuating arm 60 against a wheel 62 on the end of a pivoted lever 64. The lever 64 is pivoted at its inner end 66 in any suitable manner to the frame of the tuner for rotation about a vertical axis. The lever 64 has a central opening 68 therein through which the sleeve 70 surrounding the shaft 24 passes. A collar 72 is secured to the sleeve 70 on the lefthand side of the arm 64 as viewed in FIG. 7. Thus, as the lever 64 is pivoted in a clockwise direction looking down on the tuner, by movement of the clutch actuating bar 56, the sleeve 70 will be forced to the left by pressure on the collar 72 and pull the clutch portion 47 on the worm wheel 46 away from the associated clutch means 48 to dis-associate the same.

During movement of the treadle bar back to its low frequency position or for loading of the spring or both it is also desired to uncouple the clutch. Clutch actuating arm 56 is, therefore, also provided with a further angled arm 74 which will actuate the clutch mechanism in the same manner whenever the operating solenoid 76 is energized. The solenoid 76 is mounted on the framework of the tuner and when energized attracts its armature 78 pulling it inwardly or towards the rear of the assembly and at the same time pulling towards the rear, an arm 80 connected to the armature. The arm 80 has an angled end 82 which extends beyond the tip of the clutch actuating arm 74 so that when the solenoid is energized it will rock or rotate the clutch actuating member 56 to open the clutch. The solenoid actuated arm 80 is pivotally connected to an elongated operating member 84 pivoted at its lower extremity to the frame. This member has a bar-shaped central section 86 with elongated end members at right angles thereto which carry the pivotal mounting means. One vertical end member 88 on one end is connected to the selecting mechanism for determining whether or not the tuner is to be moved back to the low frequency end when the solenoid is energized. The vertical integral member 90 on the opposite end of cross-member 86 has a toe 92 for switch operating purposes. This member 90 also has a central arcuate slot 94 in which a pin 96 on one end of a reciprocating drive lever 98 rides. This reciprocating lever 98 is actually the driving means for the carriage as will be explained in detail and the inner end of the lever projects through and is trunnioned in opening 100 in a portion 102 of the frame. The lever 98 is offset and at an intermediate part there is connected one end of the main driving spring 104, the opposite end of which is connected to a stationary portion of the frame. Thus the spring 104 tends to urge the lever 98 forward and it in turn drives the tuning carriage forward and tunes the tuner up frequency as will be described. This lever 98 has an upwardly extending projection 106 adapted to actuate switch means to be described for controlling the energization of the solenoid.

Figure 4:
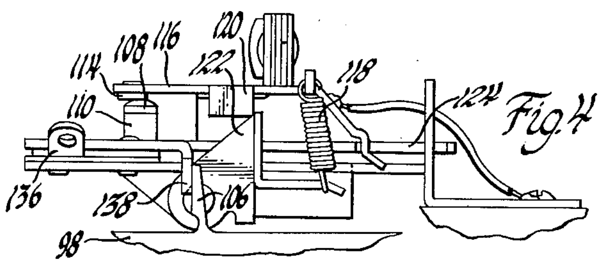
FIG. 4 is a detail view of the control switch mechanism for the power solenoid of our invention.
Figure 7:
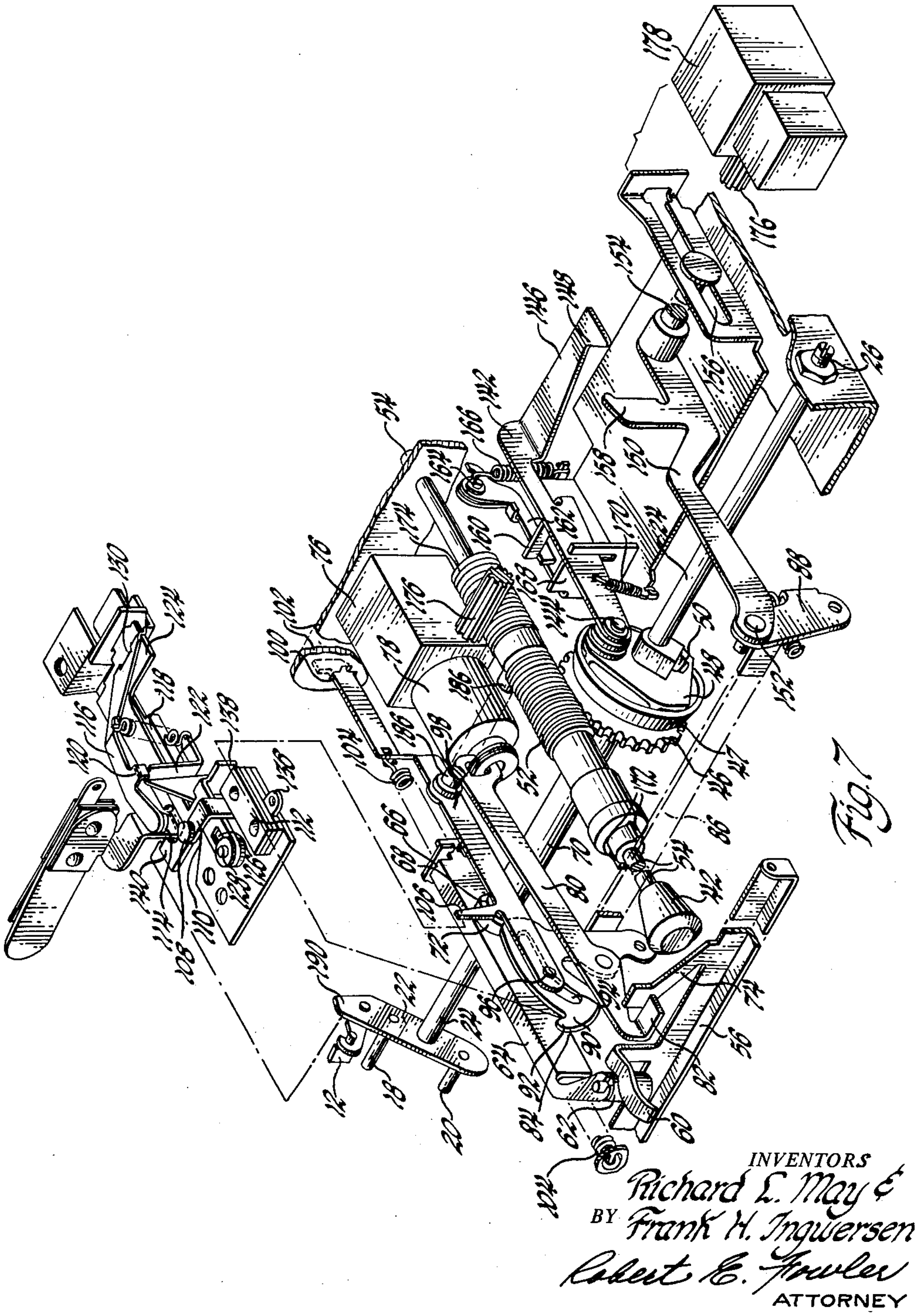

The switch means per se is shown in FIG. 4 and in perspective in FIG. 7 at a distance removed from its normal position with respect to the other parts so that the cooperation therewith may be more readily seen. However, dash and dotted lines indicate the contact between parts. The object of the switching means is, of course, to cause a closure of an electrical switch when either the power driving means has run down or become sufficiently discharged or the tuning means has reached one extremity of its travel and also to cause an opening of the switching means when the solenoid has pulled the tuning means back to the other extreme and/or completely loaded the spring driving means. The switching means itself consists of a first contact 108 which is fixedly mounted on an arm 110 extending upwardly from an insulated riveted assembly 112 on the casing. The cooperating contact is shown at 114 and that is carried by a pivotally mounted angularly shaped arm 116. The arm 116 is spring biased downwardly by a small spring 118 having one end secured to support 122 for imparting upward bias to support 122. The arm 116 also has a horizontally projecting extension 120 whose extreme end is bent downwardly to form a flange which may rest upon the top of a pyramidal support 122 during certain phases of operation or be moved off the same to allow switch closures during other phases of operation. A horizontally adjustable angular plate 124 is supported below the contact members on the surface of the support so that it may move for certain restricted distances as shown by the slot 126 near rivet 128. This is the actuating portion of the switch and as it slides back and forth, moves the arm 116 so that the same may fall down from the top of the pedestal 122 to allow engagement between contacts 108 and 114 or upon reverse movement cause the arm 116 to again be raised to its position on top of the pedestal 122 to open the switch by a small clockwise movement of support 122. The arm 116 is pivotally mounted on this sliding plate 124 by having a projection of the arm 116 extend through an opening therein as shown at 130. The terminal 136 is used to electrically connect to the lower contact 108.

To slide the actuating member 124 back and forth for operational purposes the projection 106 of the slide 98 strikes the tang 138 when the driving spring 104 has expended its power. Movement of the slide 124 to the left as shown in FIG. 7 causes the projection 120 to ride off the top of the pedestal 122 and lets the contact 114 drop to engage contact 108. This allows a completion of the electrical circuit to the solenoid 76 causing it to be energized. The energization of this solenoid causes it to draw in its armature 78 and the lever 80 attached thereto to pull the member 86 clockwise around its pivot as shown in FIG. 7. The engagement of pin 96 of the slide arm 98 at the end of slot 94 would then cause the slide arm 98 to move to the right, reloading the spring as the solenoid continued inwardly. When the toe 92 of member 90 engages the opposite side of the tank 138 it moves the slide 124 back to the rear and the projection 120 will ride up the inclined surface of the pedestal to separate the contacts and de-energize the solenoid. In the same manner after the tuner reaches an extreme high frequency position, the upper end 190 of the side arm 22 on the treadle assembly may engage the opposite extending tang 140 of the slide 124, the slide will be moved to the front as shown in FIG. 7 and the same operation will follow.

However, in the event that the treadle bar and tuner and the loading of the power driving spring have become dis-synchronized we have provided means whereby the solenoid will only reload the spring and not move the treadle bar to the rear if the treadle bar has not moved sufficiently far towards the high frequency end when the spring requires charging. This control is provided by that mechanism best shown in FIG. 7 at the righthand side and consists of a compound lever arm 142, one end of which is pivotally secured to the clutch disc 48 at 144. This lever extends towards the rear of the tuner and then has a horizontally projecting elongation 146 having an upturned flanged front 148. Since the lever 142 is rigidly connected to the clutch part 48 and thus to the shaft 24 it will always be moved as the treadle bar or tuner moves over the band. However, in order to transmit the driving power from the solenoid when it is energized to the treadle bar and tuner, engagement must be made with the extension 146 to pull the assembly and rotate shaft 24. This selective power transmitting member is a link 150 pivotally connected to the side member 88 at 152. Side member 88 is always rotated when the solenoid is energized as it is linked to the solenoid armature. The rearmost end of the lever 150 is provided with a sliding supporting pin 154 which extends into an elongated slot 156 in the side frame member as the lever reciprocates. A vertically extending finger 158 extends upwardly from the lever 150 and under certain conditions to be described, engages the upturned front 148 of the extending arm 146 to force this member back. Under other conditions this finger can pass under the arm 146 without encountering the same and thus the solenoid can be energized to reload the spring without moving the tuner.

To accomplish the desired results the lever 142 is also provided with a horizontal finger 160 which extends out over a spring biased support 162 which is pivotally mounted at 164 and held in a desired horizontal position by a spring 166. A guiding frame 168 mounted on the main frame also keeps the lever 142 in its proper general position and a weaker biasing spring 170 connected between the frame and lever 142 biases it clockwise around its pivot 144 as shown in FIG. 7. If now the tuner is positioned at its low frequency extreme point, arm 160 will lie on top of the surface of supporting arm 162 towards the rear. As the tuner proceeds over the band, arm 160 will move outwardly on this arm and since spring 166 is stronger than spring 170 will merely ride over the same and they will stay in the same relative position. However, upon reaching a position representative of the high frequency limit of the tuner, arm 160 will fall off of the end of arm 162 and at this time lever 142 will be rotated in a clockwise direction by spring 170 until lever 142 engages the surface of the guiding frame 168. At this time arm 146 will have been lowered sufficiently so that if the solenoid 76 is energized finger 158 will engage the rolled up surface 148 when it moves to the rear and this would pull the clutch half 48 clockwise about its axis rotating shaft 24 and bringing the tuner back to its lower frequency end. Movement of lever 142 to the rear brings arm 160 against the end of arm 162 which is forced down against the bias of spring 166 and thus arm 160 again slides over the upper surface of arm 162.

Figure 5:
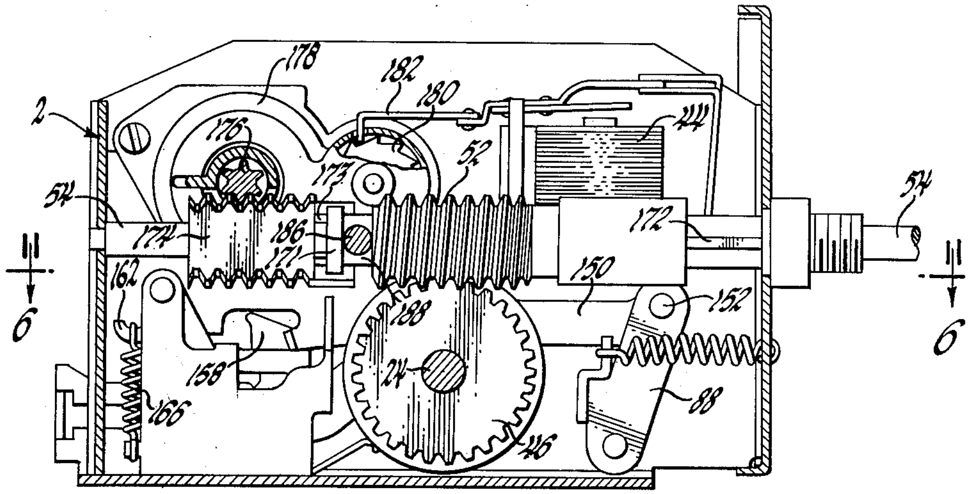
FIG. 5 is a sectional view taken on line 5—5 of FIG. 1.
Figure 6:
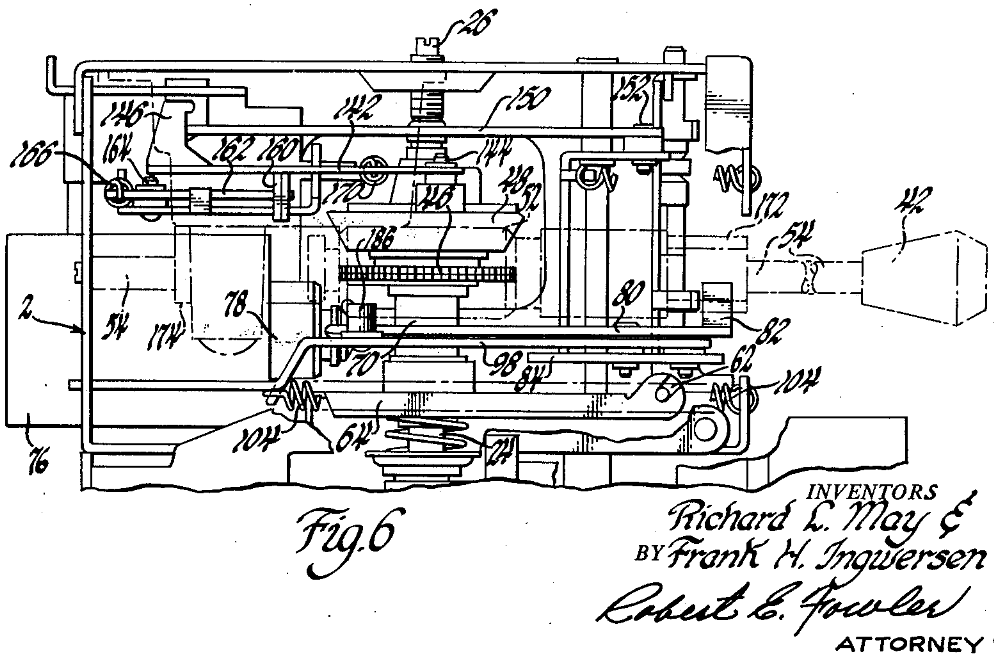
FIG. 6 is a section view on line 6—6 of FIG. 5 with parts removed and shown in dotted outline for clarity; and, FIG. 7 is a perspective view of the skeleton structure of the operating parts for the switch means controlling the solenoid some parts shown in spaced relation from their normal position.

The loading for the driving means is provided by a fly bar governor and a gear train. This is shown in FIG. 5 which best illustrates the signal seeking driving means. There is shown therein the driving gear 46 which, under signal seeking drive, is clutched to the shaft 24 through clutch member 48. The worm wheel 52 which meshes with gear 46 is splined to shaft 54 so that it may move longitudinally on said shaft but be driven by rotation of the same through the manual knob 42. The spline 172 provides this type of mechanical connection. On the same shaft 54 there is also provided a toothed drive gear 174 the threads of which have no lead and which is used as a rack which is free to slide on the shaft 54. These two members 52 and 174 are coupled together by interlocking parts including a cap 171 on worm 52 and a shallow section 173 on rack 174 so the two slide together as a unit but each can rotate independently. Axial driving movement of rack 174 and worm 52 on shaft 54 must be maintained at a relatively low rate to keep tuning speed down and this is maintained through the rack 174 driving a fluted shaft 176 which extends out over the top of the same, said shaft extending back into a reduction gear housing 178, said reduction gear train terminating in a flywheel 180 which acts as a final stage in the load drive and also as an indexing wheel. An indexing detent 182 controlled by a control relay 44 is so mounted as to drop into the same to maintain it in a given position as desired.

To drive the tuner from the loaded power spring 104 the following mechanism is provided. The spring 104 as it expends its energy pulls the slide 98 forward in its bearings. To one side of the slide 98 there is secured a transverse stub shaft 186 which extends across above the solenoid arm 80 and rests in an annular groove 188 in the worm wheel 52. Both of these members are free to slide longitudinally on the shaft 54 which is itself prevented from longitudinal movement but able to rotate. The rack 174 may rotate on shaft 54 to a limited degree but since it is mounted so close to the solenoid housing 76 one side of said rack 174 is flat and, therefore, the rotation is limited to a small arcuate distance. The worm 52 on the other hand is splined to the shaft so that any rotation of the shaft 54 caused by the manual knob 42 will cause rotation of the worm. Thus as the slide 98 moves outwardly under force of spring pressure 104 it will pull the assembly of worm 52 and rack 174 with it causing these to slide on shaft 54. The worm 52 under these conditions acts as a rack and the teeth drive the worm wheel 46 which through the clutch drives shaft 24 and thus the tuner to tune it up frequency. At this time also the rack 174 will drive the fluted shaft 176 to drive the gear train and final indexing wheel 180. All of this acts as a load and prevents the mechanism from travelling towards the front of the tuner at too fast a rate.

In explaining the complete operation of the tuner it is assumed that the relay 44 is connected in a signal actuated tuning circuit so that it is energized during periods of seeking for a station and de-energized upon receipt of a station. Such a circuit is shown in Schwarz Patent No. 2,744,193, issued May 1, 1956. It is also assumed that the switch contacts 108, 114 are connected in series circuit with the source of power and the relay 76 so that when the contacts are closed, the relay will be energized and when open, de-energized. Assuming first that the tuner is at one extreme position, for example the low frequency limit, that the spring 104 is fully loaded, the set is turned on, and lastly that the operator desires to signal tune, he then closes a switch 21 for signal seeking actuation and relay 44 will be energized. This energization causes the relay to lift detent 182 from engagement with the toothed wheel 180 and the spring 104 through the transverse rod 186 forces the worm rack 52, 174 towards the front. This motion drives the reducing gear train from fluted shaft 176 to limit the speed and also drives the tuner towards the high frequency end of the band through gear 46, clutch 48 and shaft 24. Upon arrival at the next station tuned in, relay 44 will become de-energized, dropping the detent into engagement with wheel 180 to lock the gear train and the drive will, therefore, stop on station. If the operator continues to use only signal tuning then the turner carriage will approach the other extreme position of its travel and simultaneously the spring will become discharged. As the tuner carriage approaches the front or upper frequency limit the arm 160 will reach a position where it will fall off of the upper surface of latch 162 lowering horizontally extending arm 146 of operating lever 142. Therefore, at a time when either upwardly extending arm 106 or the upper end 190 of side arm 22, engages the slide 124 to close switch 108, 114 and energize solenoid 76, the movement of the solenoid armature 78 and actuating lever 80 will both reload the spring and move the treadle bar and tuner to its other extreme position. This is accomplished as follows. As the armature 78 starts inwardly due to energization of the solenoid it takes with it arm 80 which is pivotally connected to the operating assembly 86, 84, 88. Rotation of this assembly about its lower pivotal axis will move the slide 98 to the rear through engagement with the pin 96 in one end of slot 94 as arm 84 is rotated clockwise. This reloads the spring 104. Simultaneously, rotation of the member 88 on the opposite end of transverse member 86, forces slide 150 to the rear and its upstanding finger 158 engages the rolled up front surface 148 of the arm 142 carrying it with it and, therefore, driving shaft 24 to drive the treadle bar and tuner to the rear. When this assembly has moved to its extreme rearmost position ear 92 will engage the front of tang 138 of the switch to move the operating slide rearwardly, opening switch contacts 108 and 114 to de-energize the solenoid. Thus both the tuner and the driving spring have now resumed their initial position and condition.

If now the operator depresses one of the mechanical push buttons 34 to bring the tuning mechanism to a position for tuning in a station near the upper end of the band, then the tuner will only have a small distance to travel to reach said upper extremity for automatic tuning, whereas the spring will still be practically fully charged. However, upon the next closure of the signal seeking switch the upwardly extending ear 190 on the treadle bar side arm 22 will actuate the switch 108, 114 causing the mechanism to operate, to again bring the treadle bar and tuner to its lower frequency extremity and fully charge the spring 104 since the slot 94 will provide for lost motion between clockwise movement of the arm 84 and the slide 98.

Assuming now that the signal seeking drive has been actuated until the spring 104 has become substantially discharged and that through dis-synchronous actuation of the push buttons 34 the tuner is in a position near its low frequency end and the operator now actuates the signal seeking switch, the spring 104 will attempt to drive the tuner up frequency but soon the upstanding arm 106 strikes the tang 138 to actuate switch 108, 114. The solenoid 76 is energized, pulls in its armature 78 and arm 80 and through arm 84 reloads the spring 104 by moving the slide 98 to the rear. This action, of course, also causes the slide 150 connected to the opposite arm 88 to move towards the rear. However, horizontal arm 160 now rests upon the top of spring biased support 162 since the tuner is still in a position where it does not need to be moved back and upstanding finger 158 on slide 150 passes under arm 146 and does not rack the treadle bar and tuner back to its low frequency extreme position.

Therefore, actuation of the switch 108, 114 may cause a moving of the treadle bar to the rear to its low frequency end and/or a loading of the spring 104. The set may also, of course, be manually tuned merely by rotating the knob 42 which drives directly from the worm 52, worm wheel 46, clutch 48 to the shaft 42 or the set may be tuned by the depression of any of the mechanical preset buttons 34.

What is claimed is:

1. In radio receiving means, movable means for tuning the radio receiving means over a predetermined frequency band, clutch means connected to said movable means, spring loaded driving means coupled to said clutch means to drive the movable means for tuning the radio receiving means through said clutch means, solenoid means connected directly to said spring loaded driving means to load the same upon energization, pivotal linkage driving means connected to said movable means for tuning the radio receiving means which follows a prescribed path during movement of the movable means for tuning and which moves to a different level at one extremity of travel, reciprocating actuating means connected to said solenoid means and movable therewith as the solenoid is energized, said reciprocating actuating means so positioned as to engage said pivotal linkage driving means if the latter is at its one level assumed at the extremity of travel but to pass by the same if the pivotal linkage driving means is at its other level so that the movable means for tuning the radio receiver will not be moved by the solenoid energization unless it is near an extremity of its travel.

2. In a radio receiving means, movable means for tuning the radio receiving means over a predetermined frequency band, clutch means connected to said movable means, spring loaded driving means coupled to said clutch means to drive the movable means for tuning the ratio receiving means through said clutch means, solenoid means connected directly to said spring loaded driving means to load the same upon energization, unitary switching means connected to the solenoid to control the same and mounted adjacent the spring loaded driving means and the movable means for tuning the radio receiving means, switch actuating projections on both the spring loaded driving means and the movable means for tuning the radio receiving means engageable with the switching means at extreme positions of travel so that movement of either said spring loaded driving means or the movable means for tuning the radio receiving means to such extreme positions will energize and de-energize the solenoid means to directly load the spring loaded driving means or move the movable means for tuning the radio receiving means to an extreme position independently in any order or simultaneously.

3. In a radio receiving apparatus, tuning means for tuning the receiver over a predetermined band of frequencies, a reciprocating carriage upon which said tuning means is mounted, a spring biased reciprocating slide to drive the carriage in one direction of travel, a solenoid connected to said reciprocating slide for moving the same in opposition to the spring to load the spring, clutch means interconnecting said reciprocating slide and said carriage, electrical switching means mounted adjacent the reciprocating carriage and reciprocating slide and connected to the solenoid means to control the same, switch actuating projections on the reciprocating slide and reciprocating carriage to control energization of the solenoid means by the positions of either the carriage or slide, a pivoted arm connected to said reciprocating carriage and moving horizontally with carriage travel, spring biased supporting means engaging the pivoted arm and holding it up over the major portion of its travel but not extending to the full travel so that the arm may move off of said spring biased supporting means and fall to a lower level and an actuating bar coupled to said solenoid and moved upon energization of the same, said actuating bar mounted to move in a path to engage the pivoted arm if it is at its lower level but to pass under the same if it is being supported by the spring biased supporting means so that the reciprocating carriage will be moved to its limit position if it has substantially reached its opposite limit when the solenoid is energized but will not be moved if it has not substantially reached its opposite limit and the solenoid is energized.

References Cited in the file of this patent

UNITED STATES PATENTS

| | | |
|---|---|---|
| 2,706,787 | Sperber | Apr. 19, 1955 |
| 2,851,887 | Wright et al. | Sept. 16, 1958 |
| 2,857,519 | Gaskill et al. | Oct. 21, 1958 |
| 2,864,957 | Laschenski | Dec. 16, 1958 |
| 2,898,464 | Gaskill et al. | Aug. 4, 1959 |

UNITED STATES PATENT OFFICE

CERTIFICATE OF CORRECTION

Patent No. 3,037,390 June 5, 1962

Richard L. May et al.

It is hereby certified that error appears in the above numbered patent requiring correction and that the said Letters Patent should read as corrected below.

Column 8, line 56, after "will" insert -- actuate said switching means and --.

Signed and sealed this 11th day of September 1962.

(SEAL)
Attest:

ERNEST W. SWIDER
Attesting Officer

DAVID L. LADD
Commissioner of Patents